(12) United States Patent
Huang et al.

(10) Patent No.: US 9,871,048 B1
(45) Date of Patent: Jan. 16, 2018

(54) MEMORY DEVICE

(71) Applicant: United Microelectronics Corp., Hsinchu (TW)

(72) Inventors: Chun-Hsien Huang, Tainan (TW); Ching-Cheng Lung, Tainan (TW); Yu-Tse Kuo, Tainan (TW); Li-Ping Huang, Miaoli County (TW); Chun-Yen Tseng, Tainan (TW)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 15/621,754

(22) Filed: Jun. 13, 2017

(30) Foreign Application Priority Data

May 8, 2017 (TW) .............................. 106115146 A (51) Int. Cl.
*H01L 27/02* (2006.01)
*H01L 27/11* (2006.01)
*G11C 11/412* (2006.01)

(52) U.S. Cl.
CPC ........ *H01L 27/1104* (2013.01); *G11C 11/412* (2013.01); *H01L 27/0207* (2013.01)

(58) Field of Classification Search
CPC ...... H01L 27/02; H01L 27/11; H01L 27/1104; H01L 27/0207; H01L 27/0924; H01L 27/1211; H01L 27/3223; H01L 29/06; H01L 29/66; H01L 29/78
USPC ........................................................ 257/369
See application file for complete search history.

(56) References Cited

U.S. PATENT DOCUMENTS

| | | | |
|---|---|---|---|
| 7,612,417 B2 | 11/2009 | Osada et al. | |
| 7,663,237 B2 * | 2/2010 | Peng | H01L 21/76895 257/750 |
| 8,582,352 B2 | 11/2013 | Liaw | |
| 2007/0249151 A1 * | 10/2007 | Kadoya | H01L 21/76897 438/597 |
| 2012/0025316 A1 * | 2/2012 | Schultz | H01L 21/845 257/368 |
| 2015/0380078 A1 | 12/2015 | Liaw | |

* cited by examiner

*Primary Examiner* — Chuong A Luu
(74) *Attorney, Agent, or Firm* — J.C. Patents (57) ABSTRACT

A memory device includes a pickup area extending along a first direction. The pickup area includes at least one N-pickup structure, distributing along an N-pickup line extending at the first direction. At least one P-pickup structure distributes by alternating with the N-pickup structure at the first direction and interleaves with the N-pickup structure at a second direction. The second direction is perpendicular to the first direction. Dummy pickup structure distributes along the first direction, opposite to the P-pickup structure with respect to the N-pickup line. Further, a cell area is beside the pickup area. The SRAM cells in the cell area form cell rows extending along the second direction. Each SRAM cell covers one N-type well region along the second direction and two P-type well regions along the second direction to sandwich the N-type well region. The N-pickup/P-pickup structures respectively provide first/second substrate voltage to the N-type/P-type well regions.

20 Claims, 10 Drawing Sheets

MEMORY DEVICE

CROSS REFERENCE TO RELATED APPLICATION

This application claims the priority benefits of Taiwan application serial no. 106115146, filed on May 8, 2017. The entirety of the above-mentioned patent application is hereby incorporated by reference herein and made a part of specification.

BACKGROUND OF THE INVENTION

1. Field of the Invention

The invention relates to a semiconductor manufacturing technique. More particularly, the invention relates to a memory device.

2. Description of Related Art

In semiconductor manufacturing techniques, a three-dimensional structure has already been provided to reduce the size of transistors, for example, the fin field effect transistors (FinFETs), and the FinFETs replace the source and the drain of the substrate through the protruding fin structures, such that areas of elements as used are effectively reduced.

A memory device uses significant amount of transistors to form a memory cell. For instance, circuits of the memory cell of a static random-access memory device form a memory cell by using, e.g., six or more transistors. For instance, one memory cell includes two inverters. Each of the inverters includes P-type metal-oxide-semiconductor (PMOS) field effect transistors and N-type metal-oxide-semiconductor (NMOS) field effect transistors. Moreover, other types of the NMOS field effect transistors are also included to form a bilaterally symmetrical structure.

The P-type and the N-type field effect transistors are arranged in a manner that a set of the P-type field effect transistors are placed in the middle, and two sets of the N-type field effect transistors are place on the two sides to sandwich the set of the P-type field effect transistors. Generally, the substrate of the P-type field effect transistors is provided by the N-type well region, and the substrate of the N-type field effect transistors is provided by the P-type well region. Thereby, a pickup structure is required in the overall memory device to provide two types of substrate voltages to the system voltages of the P-type well region and the N-type well region at the bottom.

When the memory device is manufactured by adopting the FinFETs, in order to provide the two substrate voltages to the system voltages of the P-type well region and the N-type well region at the bottom, positions of a plurality of N-pickup structures and a plurality of P-pickup structures are required to be designed properly in terms of layout. As such, the layout of the memory cell is structural symmetrical, and operating performance is thus maintained to be consistent.

SUMMARY OF THE INVENTION

The invention provides a memory device designed according to a layout of pickup for maintaining symmetry of a structure of a memory cell.

According to an embodiment of the invention, a memory device is provided and includes a pickup area extending in a first direction. The pickup area includes at least one N-pickup structure distributing along an N-pickup line. The N-pickup line extends in the first direction, and the at least one N-pickup structure receives a first substrate voltage. At least one P-pickup structure is alternatively disposed with the at least one N-pickup structure in the first direction and is interleaving disposed with the at least one N-pickup structure in a second direction. The second direction is perpendicular to the first direction. The at least one N-pickup structure receives a second substrate voltage. At least one dummy pickup structure is distributed in the first direction and is opposite to the at least one P-pickup structure with respect to the N-pickup line. A cell area is adjacent to the pickup area. At least one static random access memory (SRAM) cell is distributed in the second direction and forms at least one memory row. The at least one memory row includes an N-type well region in the second direction and two P-type well regions sandwiching the N-type well region in the second direction. The at least one N-pickup structure provides the first substrate voltage to the respective corresponding N-type well region. The at least one P-pickup structure provides the second substrate voltage to the at least one respective corresponding P-type well region.

According to an embodiment of the invention, in the memory device, the cell area includes a first array area and a second array area to sandwich the pickup area. The two P-type well regions of the at least one memory row is a first P-type well region and a second P-type well region. The at least one P-pickup structure includes a first P-pickup structure located at a first side of the pickup area to provide the second substrate voltage to the first P-type well region. A second P-pickup structure is located at a second side of the pickup area opposite to the first side to provide the second substrate voltage to the second P-type well region.

According to an embodiment of the invention, in the memory device, an N-pickup line is located at a middle of the pickup area, and the at least one P-pickup structure is alternatively disposed at a left side and a right side of the N-pickup line or at the right side and the left side of the N-pickup line.

According to an embodiment of the invention, in the memory device, the pickup area includes six or more polysilicon lines of even numbers extending in the first direction.

According to an embodiment of the invention, in the memory device, the pickup area is opposite to an edge area of the cell area. The at least one P-pickup structure is distributed along a P-pickup line, and the P-pickup line extends in the first direction and is located between the N-pickup line and an edge of the cell area.

According to an embodiment of the invention, in the memory device, the pickup area includes four or more polysilicon lines of even numbers extending in the first direction.

According to an embodiment of the invention, in the memory device, at least one of the SRAM cell includes at least one P-type fin field effect transistor (FinFET), at least one first N-type FinFET, and at least one second N-type FinFET. The at least one P-type FinFET is disposed in the same corresponding N-type well region, the at least one first N-type FinFET is disposed above the respective corresponding P-type well region, and the at least one second N-type FinFET is disposed above the same respective corresponding P-type well region.

According to an embodiment of the invention, in the memory device, the at least one SRAM cell includes six FinFETs.

According to an embodiment of the invention, in the memory device, the pickup area and the cell area are adjacent areas planned on a substrate.

According to an embodiment of the invention, in the memory device, a surface of the substrate has at least one fin structure extending in the second direction.

According to an embodiment of the invention, in the memory device, a dielectric layer is further provided, is disposed on the substrate and is located between the at least one fin structure. The dielectric layer is lower than the at least one fin structure.

According to an embodiment of the invention, in the memory device, the at least one N-pickup structure in the pickup area includes at least one fin structure formed on an upper surface of the substrate and extends in the second direction. The dielectric layer is disposed on the substrate and is located between the at least one fin structure. The dielectric layer is lower than the at least one fin structure. An electrically-connected structure is located on the dielectric layer and extends in the first direction. The electrically-connected structure crosses through and is in contact with the at least one fin structure.

According to an embodiment of the invention, in the memory device, two adjacent N-pickup structures share the same electrically-connected structure.

According to an embodiment of the invention, in the memory device, the electrically-connected structure crosses through two adjacent fin structures.

According to an embodiment of the invention, in the memory device, a contact point structure is further included and is connected the electrically-connected structure.

According to an embodiment of the invention, in the memory device, the two adjacent N-pickup structures are connected to each other through the shared electrically-connected structure for providing the first substrate voltage to two adjacent P-type well regions.

According to an embodiment of the invention, in the memory device, the at least one P-pickup structure in the pickup area includes at least one fin structure formed on an upper surface of the substrate and extends in the second direction. The dielectric layer is disposed on the substrate and is located between the at least one fin structure. The dielectric layer is lower than the at least one fin structure. An electrically-connected structure is located on the dielectric layer and extends in the first direction. The electrically-connected structure crosses through and is in contact with the at least one fin structure.

According to an embodiment of the invention, in the memory device, the electrically-connected structure crosses through two adjacent fin structures.

According to an embodiment of the invention, in the memory device, the at least one dummy pickup structure is also disposed on the dielectric layer but is not in contact with the at least one fin structure.

According to an embodiment of the invention, in the memory device, the polysilicon lines extending in the first direction are further included in the second direction between the at least one N-pickup structure and the at least one P-pickup structure. Moreover, two polysilicon lines symmetrical to the N-pickup line are included between the at least one P-pickup structure and the at least one dummy pickup structure.

To make the aforementioned and other features and advantages of the invention more comprehensible, several embodiments accompanied with drawings are described in detail as follows.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

The invention relates to manufacturing of a memory device. The memory device is, for example, a static random-access memory (SRAM) device. In the invention, the SRAM device is exemplified as the memory device, and the memory device is disposed in a manner of an N-pickup structure and a P-pickup structure.

Figure 1:
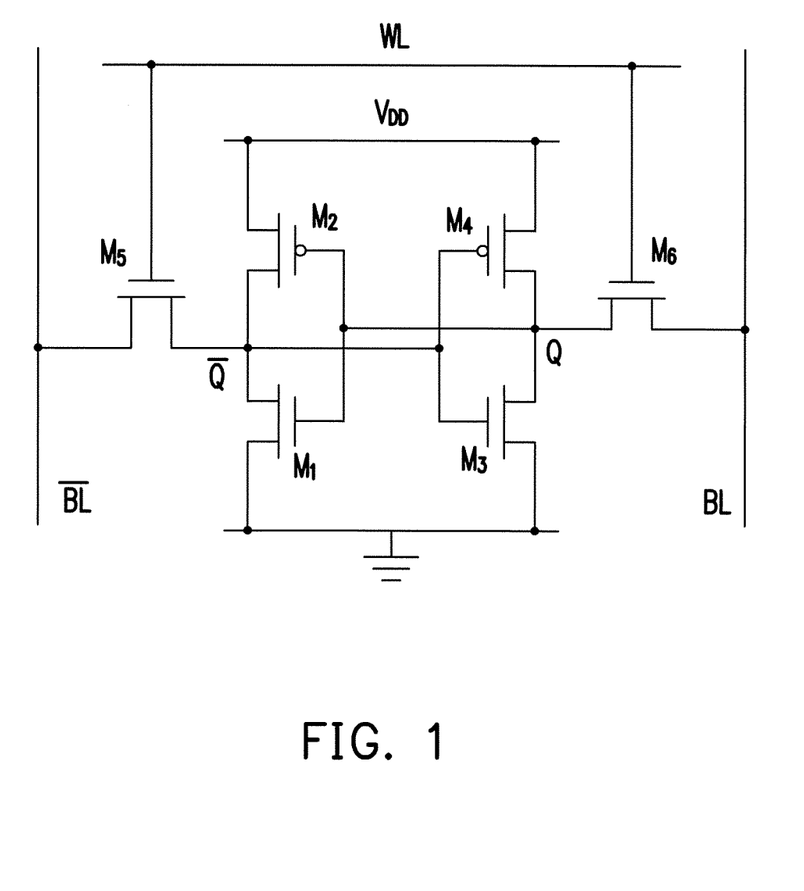
FIG. 1 is a schematic diagram of a circuit structure of a static random access memory device according to an embodiment of the invention.

FIG. 1 is a schematic diagram of a circuit structure of a SRAM device according to an embodiment of the invention. Referring to FIG. 1, a six-transistor (6T) SRAM circuit is taken for example. A circuit of a memory cell basically includes two inverters. One of the inverters includes an n-type metal-oxide-semiconductor (NMOS) transistor M1 and a p-type metal-oxide-semiconductor (PMOS) transistor M2, and the other inverter includes an NMOS transistor M3 and a PMOS transistor M4. In addition, two other NMOS transistors M5 and M6 configured to control are connected to the inverters. As such, a structure in which transistors are bilaterally and symmetrically arranged is formed. A terminal of each of the PMOS transistors of the inverter is connected to a voltage VDD, and a terminal of each of the NMOS transistors is connected to a ground voltage. The NMOS transistors M5 and M6 are controlled by bit lines and word lines.

Comparing to a SRAM circuit structure, when a plurality of transistors of a memory cell array are distributed, the PMOS transistors are planned on a mw line, and the NMOS transistors are disposed on an upper row and a lower row of a PMOS row according to the symmetrical relations of the circuits. The PMOS transistors are formed above an N-type well region of a common strip, and a first substrate voltage, for example, Vcc, is provided by an N-type pickup. The NMOS transistors located on two sides of the N-type well region are formed above two common P-type well regions, and another voltage, for example, Vss, is provided by a P-type pickup. The memory cell array is planned into a plurality of cell areas, and a pickup area exists between two adjacent cell areas. The N-type pickup and the P-type pickup are configured to be disposed on the pickup area, to provide substrate voltages to the N-type well region and the P-type well regions.

Figure 2:
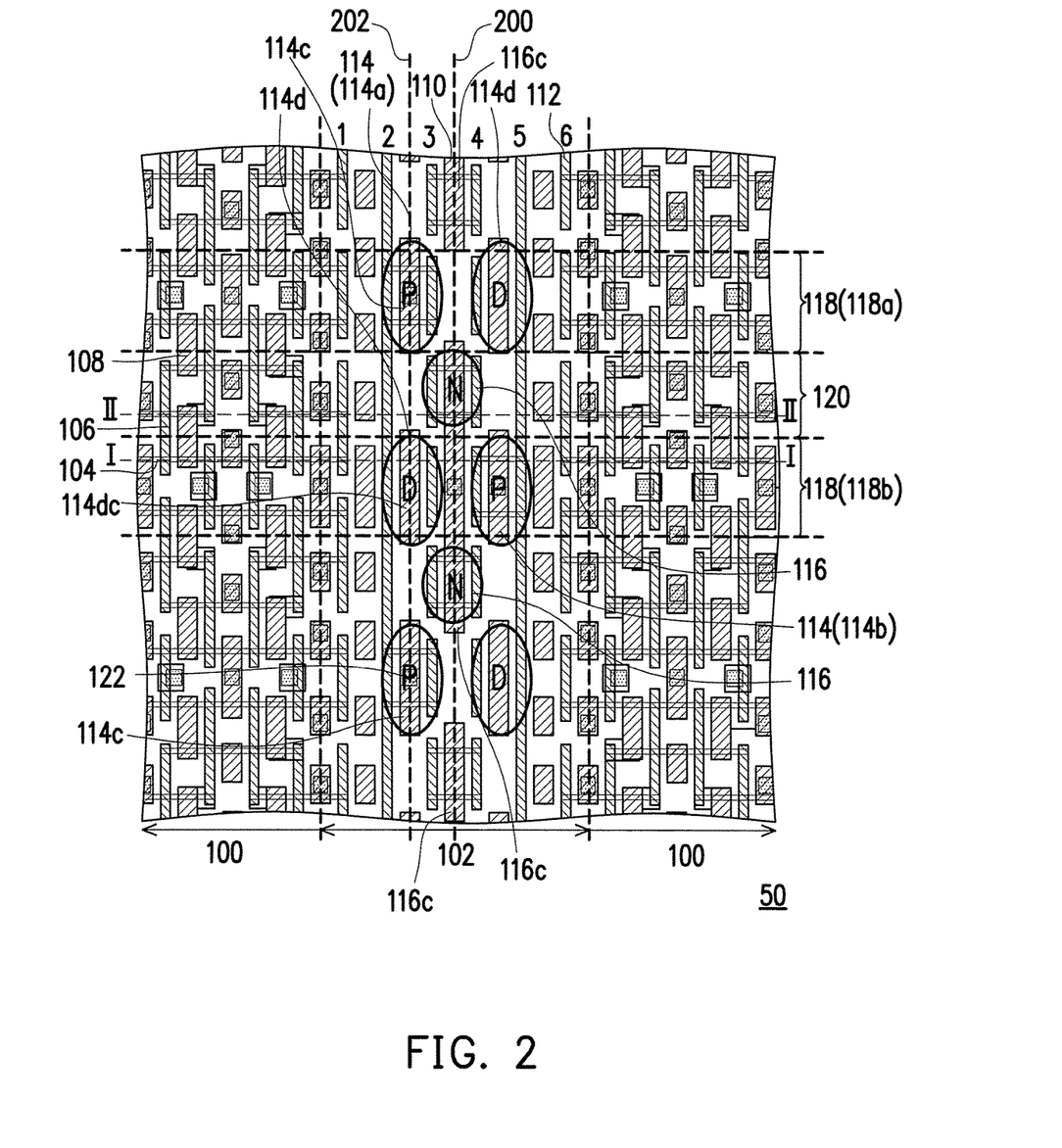
FIG. 2 is a schematic diagram of a layout of a memory device according to an embodiment of the invention.
Figure 3:
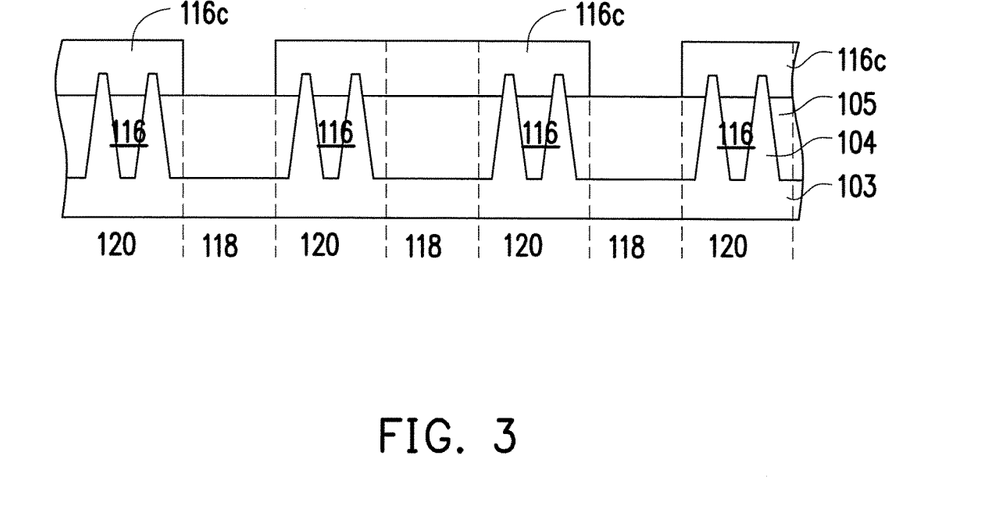
FIG. 3 is a schematic cross-sectional view of along a partial N-pickup line 200 of FIG. 2 according to an embodiment of the invention.
Figure 4:
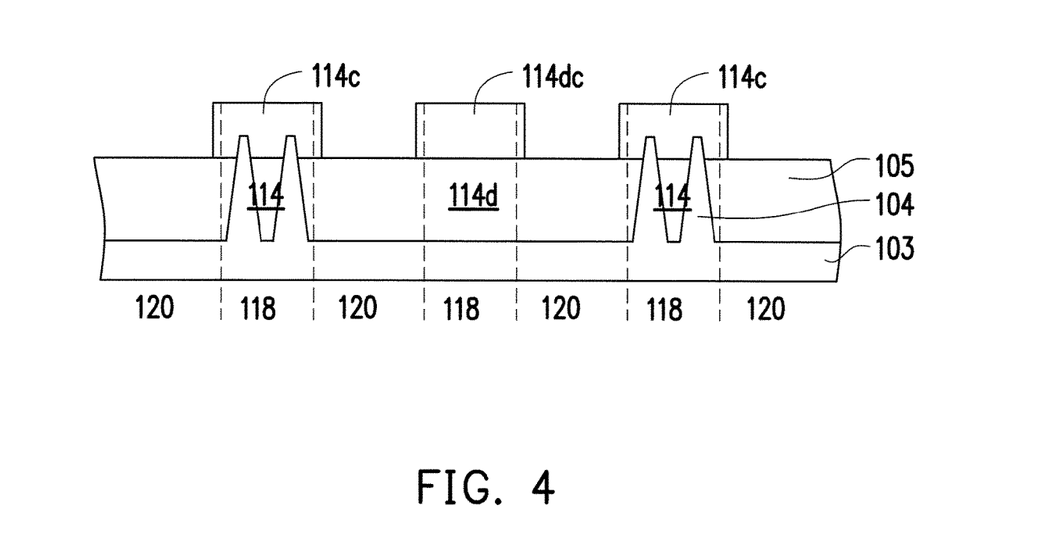
FIG. 4 is a schematic cross-sectional view along a partial P-pickup line 202 of FIG. 2 according to an embodiment of the invention.
Figure 5:
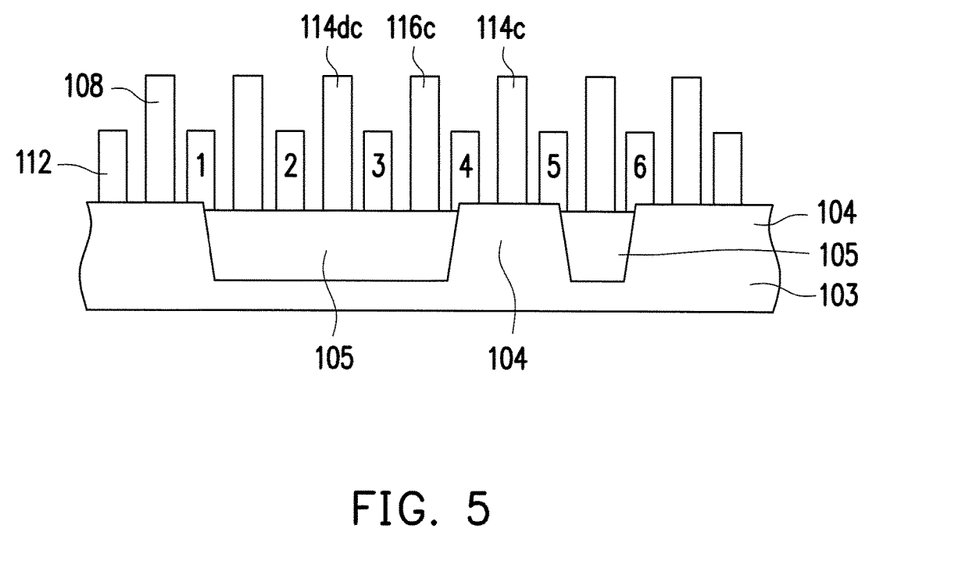
FIG. 5 is a schematic cross-sectional view along a partial tangent line I-I of FIG. 2 according to an embodiment of the invention.
Figure 6:
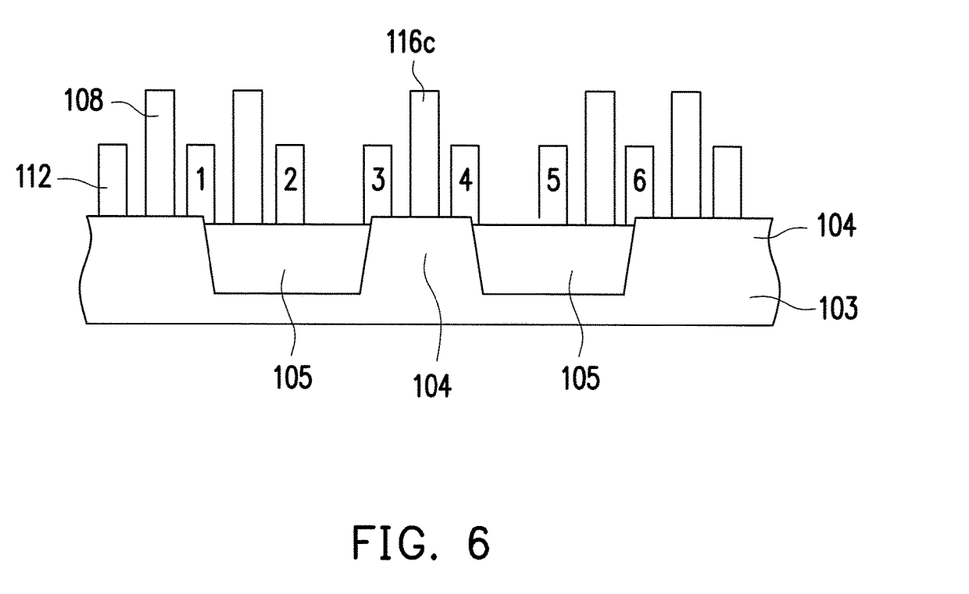
FIG. 6 is a schematic cross-sectional view along a partial tangent line II-II of FIG. 2 according to an embodiment of the invention.

Herein, several embodiments of the invention are introduced to further describe the invention; however the invention is not limited by the embodiments. FIG. 2 is a schematic diagram of a layout of a memory device according to an embodiment of the invention. FIG. 3 is a schematic cross-sectional view along a partial N-pickup line 200 of FIG. 2 according to an embodiment of the invention. FIG. 4 is a schematic cross-sectional view along a partial P-pickup line 202 of FIG. 2 according to an embodiment of the invention. FIG. 5 is a schematic cross-sectional view along a partial tangent line I-I of FIG. 2 according to an embodiment of the invention. FIG. 6 is a schematic cross-sectional view along a partial tangent line II-II of FIG. 2 according to an embodiment of the invention. Referring to FIG. 2, FIG. 3, and FIG. 6, a memory device 50 designed by using a fin field effect transistor (FinFET) includes cell areas 100 and a pickup area 102. The pickup area 102 is located between two cell areas 100. The vertical direction is defined as a first direction, and the horizontal direction is defined as a second direction in order to conveniently describe a layout of elements. The first direction is perpendicular to the second direction.

In terms of the design of the FinFET, fin structures 104 constituting a source and a drain extend in the horizontal direction. Gate structures 106 extending in the vertical direction intersect with the fin structures 104. The gate structures 106 are generally made of, for example, polysilicon. As the gate structures 106 extend along an identical vertical line; thereby, the gate structures 106 may be called as a gate line as a whole. In addition, a plurality of electrically-connected structures 108 are formed among the gate line and are properly connected to the transistors to form a circuit structure of the memory cell. Detailed structures of the memory device 50 should be understood by people having ordinary skill in the art and thus are not described hereinafter. The following describes a plurality of N-pickup structures 116 and a plurality of P-pickup structures 114 of the FinFETs in the pickup area 102. The N-pickup structures 116 are marked as N, and the P-pickup structures 114 are marked as P.

The cell areas 100 are adjacent to the pickup area 102. A plurality of cells are distributed in the second direction to form a plurality of memory rows. Each of the memory rows covers one N-type well region 120 in the second direction and two P-type well regions 118 sandwiching the N-type well region 120 in the second direction. A plurality of P-type FinFETs are formed above the N-type well region 120 and are distributed in the horizontal direction. The N-type well region 120 is shared by the P-type FinFETs. A plurality of N-type FinFETs are formed above the P-type well regions 118 and are distributed in the horizontal direction as well. The P-type well regions 118 are shared by the N-type FinFETs.

A cell of the SRAM includes one N-type well region 120 and two P-type well regions 118 sandwiching the N-type well region 120. The two P-type well regions 118 may include a first P-type well region 118a and a second P-type well region 118b. Accordingly, the P-pickup structure 114 includes a first P-pickup structure 114a and a second P-pickup structure 114b. The first P-pickup structure 114a is located at a first side of the pickup area 102 for providing a second substrate voltage (vss) to the first P-type well region 118a. The second P-pickup structure 114b is located at a second side of the pickup area 102 opposite to the first side for providing the second substrate voltage (vss) to the second P-type well region 118b.

In the pickup area 102, two adjacent N-pickup structures 116 are connected by a connecting structure 110 according to a stacking structure of a three-dimensional architecture for the SRAM circuit of the FinFET, and a substrate voltage, for example, Vcc, of the N-type well region 120 is provided through the N-pickup structure 116. Besides, a substrate voltage, for example, Vss, of the P-type well region 118 is provided through the P-pickup structure 114.

The N-pickup structures 116 are distributed along an N-pickup line 200. The N-pickup line 200 extends in the first direction, i.e., the vertical direction illustrated in the embodiment. The P-pickup structure 114 located between the two adjacent N-pickup structures 116 is not aligned with the N-pickup structures 116 on a same line, such that the P-pickup structure 114 and the N-pickup structure 116 have to be arranged in a staggered manner. As the overall structure is bilaterally symmetrical, such that the P-pickup structures 114 are disposed alternatively with the N-pickup structures 116 in the first direction, i.e., the vertical direction. Moreover, the P-pickup structures 114 are also interleavingly disposed with the N-pickup structures 116 in the second direction, i.e., the horizontal direction.

In other words, the N-pickup line 200 is located at a middle of the pickup area 102. The P-pickup structures 114 are alternatively disposed at a left side and a right side of the N-pickup line 200 or are alternatively disposed at the right side and the left side of the N-pickup line 200.

As the P-pickup structures 114 are not aligned above the N-pickup line 200 and are disposed bilaterally, such that a plurality of dummy pickup structures 114d are disposed in the pickup area 102 and are distributed in the first direction as well. The N-pickup line 200 is opposite to the P-pickup structures 114.

In addition, a contact point structure 122 is connected to the connecting structure 110 and is configured to be connected to a Vss power line through a Vcc power line (shown in FIG. 8), to provide the substrate voltage corresponding to the well regions.

Furthermore, six or more polysilicon lines 112 of even numbers extending in the first direction may be included in the pickup area 102 and are disposed on the fin structures 104 such that the symmetrical structure required is completed.

The cross-sectional structures in the two directions of FIG. 3 to FIG. 6 are further described as follows. The fin structures 104 are located on a substrate 103, and the substrate 103 may be, for example, a silicon substrate. The fin structures 104 are formed on a surface of the substrate 103. In other words, the fin structures 104 protrude from the substrate 103, and thereby, a dielectric layer 105, for example, a silicon oxide layer, is formed between the fin structures 104, and that the fin structures 104 are maintained at a certain level and the connecting structure may be successfully formed subsequently.

Each of the N-pickup structures 116 in FIG. 3 covers two fin structures 104. The electrically-connected structures 108 belonging to the N-pickup structures 116 are further marked as electrically-connected structures 116c herein to make differentiation and provide better understanding. The P-pickup structures 114 in FIG. 4 belong to the electrically-connected structures 108 of the P-pickup structures 114 and are further marked as electrically-connected structures 114c herein. Besides, the electrically-connected structures 108 belonging to the dummy pickup structures 114d are further marked as electrically-connected structures 114dc herein. No fin structure 104 is required to be disposed below the dummy pickup structures 114d.

FIG. 5 illustrates a cross-sectional structure of the P-type well regions 118 extend along the fin structures 104. The polysilicon lines 112 are marked as, for example, 1, 2, 3, 4, 5, and 6, in the pickup area 102. The electrically-connected structure 114dc of the dummy pickup structures 114d (D) located between the polysilicon line 2 and the polysilicon line 3 is not in contact with the fin structure 104. On the contrary, the electrically-connected structures 114c of the P-pickup structures 114 (P) is in contact with the fin structure 104. In an embodiment, the electrically-connected structure 114dc of the dummy pickup structures 114d (D) and the electrically-connected structure 114c of the P-pickup structures 114 are disposed opposite to each other with respect to the electrically-connected structure 116c, such that favorable structural symmetry is able to be maintained.

FIG. 6 illustrates a cross-sectional structure of the N-type well regions 120 extend along the fin structures 104. The N-pickup structure 116 located between the polysilicon line 3 and the polysilicon line 4 includes the electrically-connected structure 116c connected to the corresponding fin structure 104. The layout of the P-pickup structures 114 and the N-pickup structures 116 on a flat surface is described above. Descriptions of the stacking structures in the vertical direction are omitted herein as the stacking structures may be patterned through the general semiconductor manufacturing process.

Figure 7:
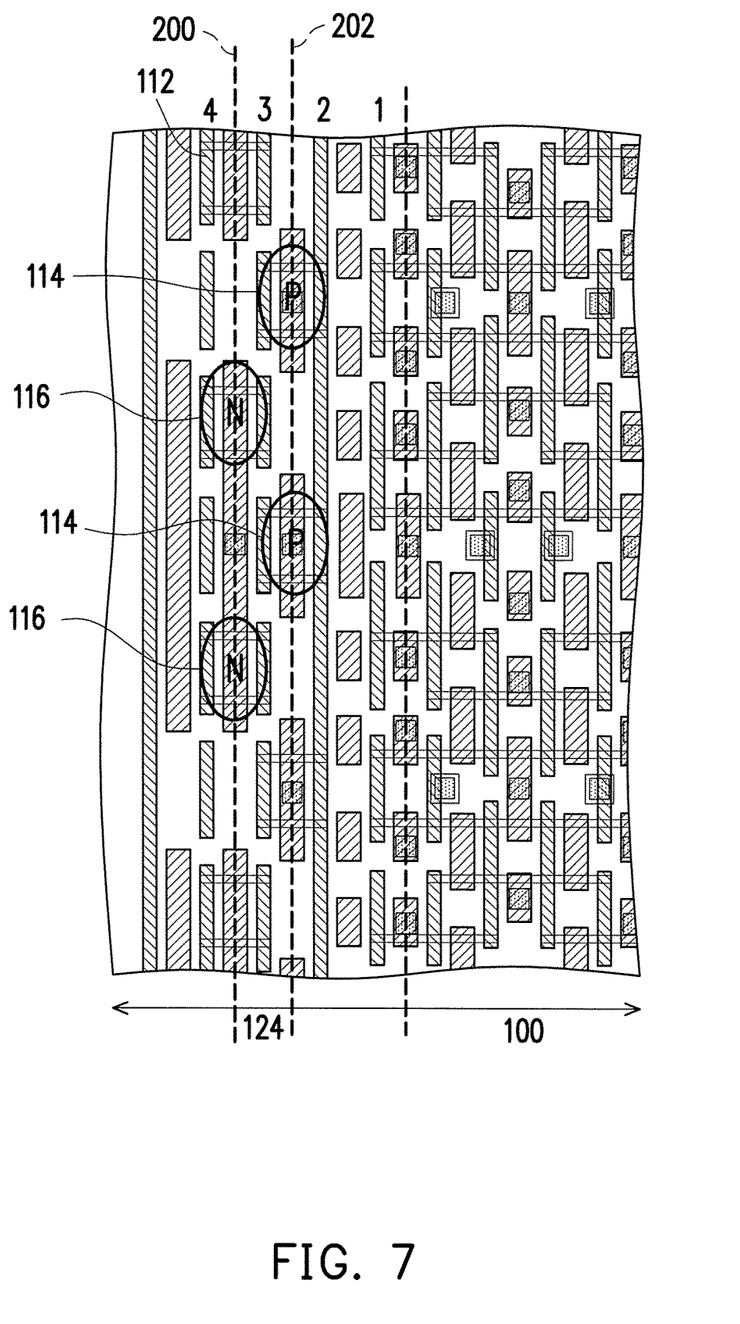
FIG. 7 is a schematic diagram of a layout of a memory device according to an embodiment of the invention.

FIG. 7 is a schematic diagram of a layout of a memory device according to an embodiment of the invention. Referring to FIG. 7, another pickup area 124 may also be disposed at an edge of the cell area 100. As the pickup area 124 is located at an outermost edge of the cell area 100, the P-pickup structures 114 may be aligned on the same line and may be called as a P-type pickup 202. In the present embodiment, the P-type pickup 202 is located between an N-type pickup 200 and the edge of the cell area 100. Besides, a number of the polysilicon lines 112 disposed in the pickup area 124 is four or more than four.

Figure 8:
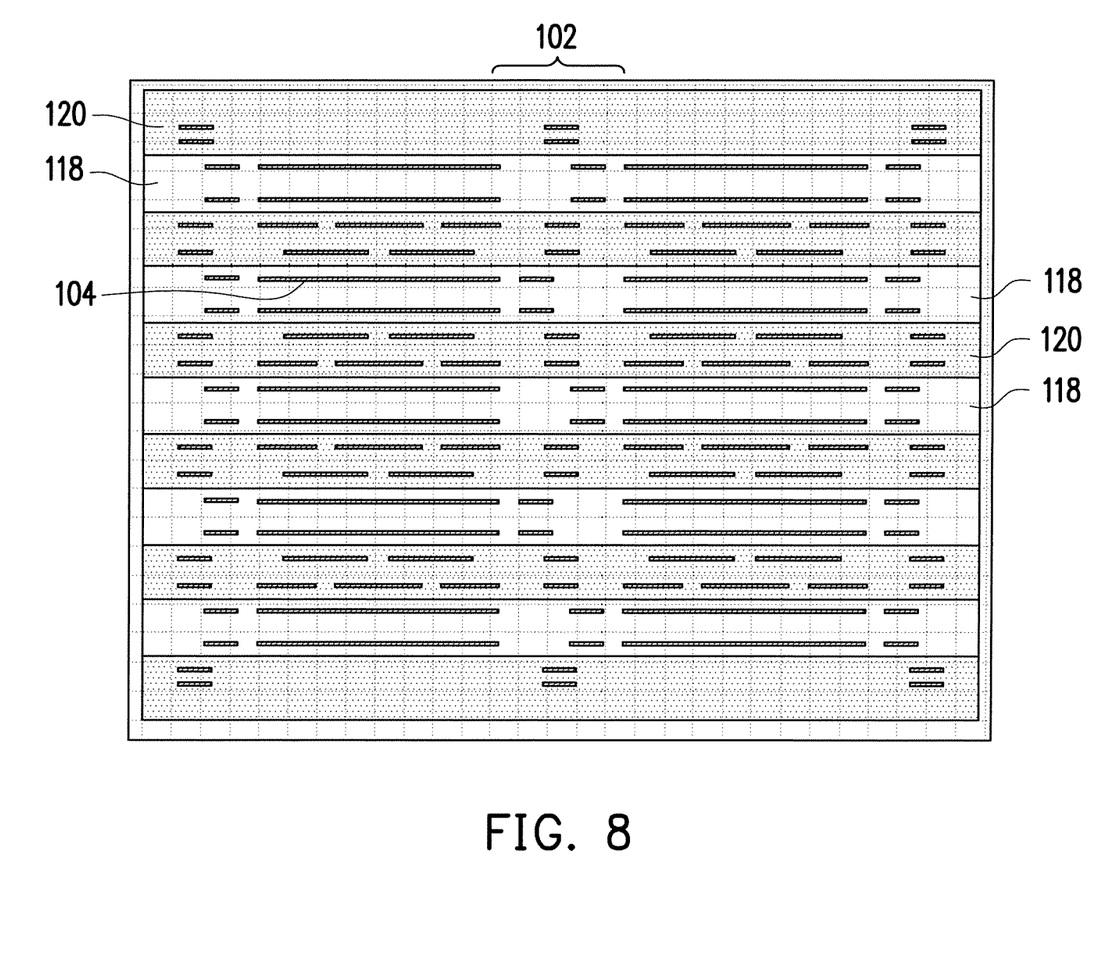
FIG. 8 is a schematic diagram of a partial layout of a memory device according to an embodiment of the invention.

Layout structures of some stacking layers are described in the following embodiment in detail. FIG. 8 is a schematic diagram of a partial layout of a memory device according to an embodiment of the invention. Referring to FIG. 8 P-type well regions 118 and N-type well regions 120 are first formed on predetermined positions in the substrate and are disposed in an intersecting manner. In addition, relative manufacturing process to form the fin structures 104 is performed on the substrate as well. N-type transistors are to be subsequently formed above the P-type well regions 118. P-type transistors are to be subsequently formed above the N-type well regions 120.

Figure 9:
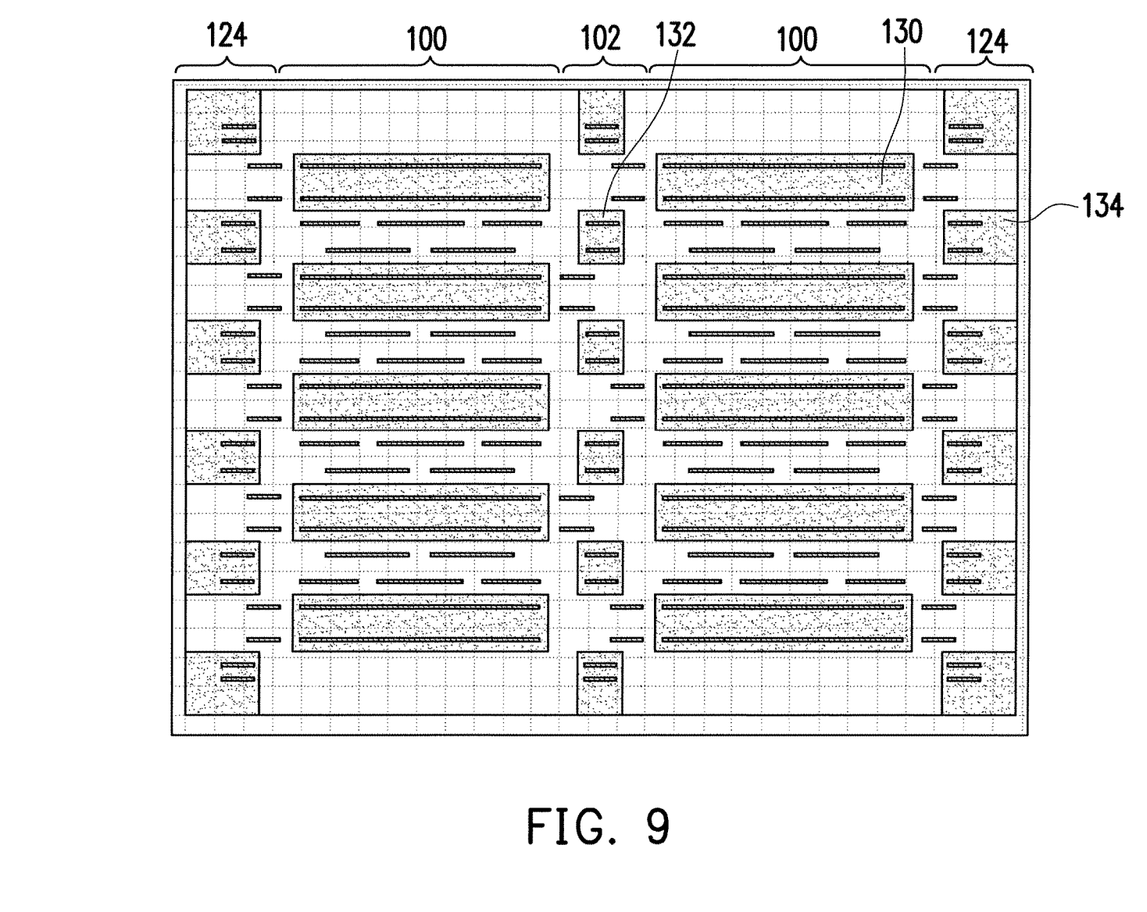
FIG. 9 is a schematic diagram of a partial layout of a memory device according to an embodiment of the invention.

FIG. 9 is a schematic diagram of a partial layout of a memory device according to an embodiment of the invention. Referring to FIG. 9, after the structure in FIG. 8 is completed, the P-type transistor requires a P+ doped region 130, a doped region 132, a doped region 134 corresponding to the cell area 100, the pickup area 102, and the pickup area 124, and the "P+" refers to P-type doping of high concentration.

Figure 10:
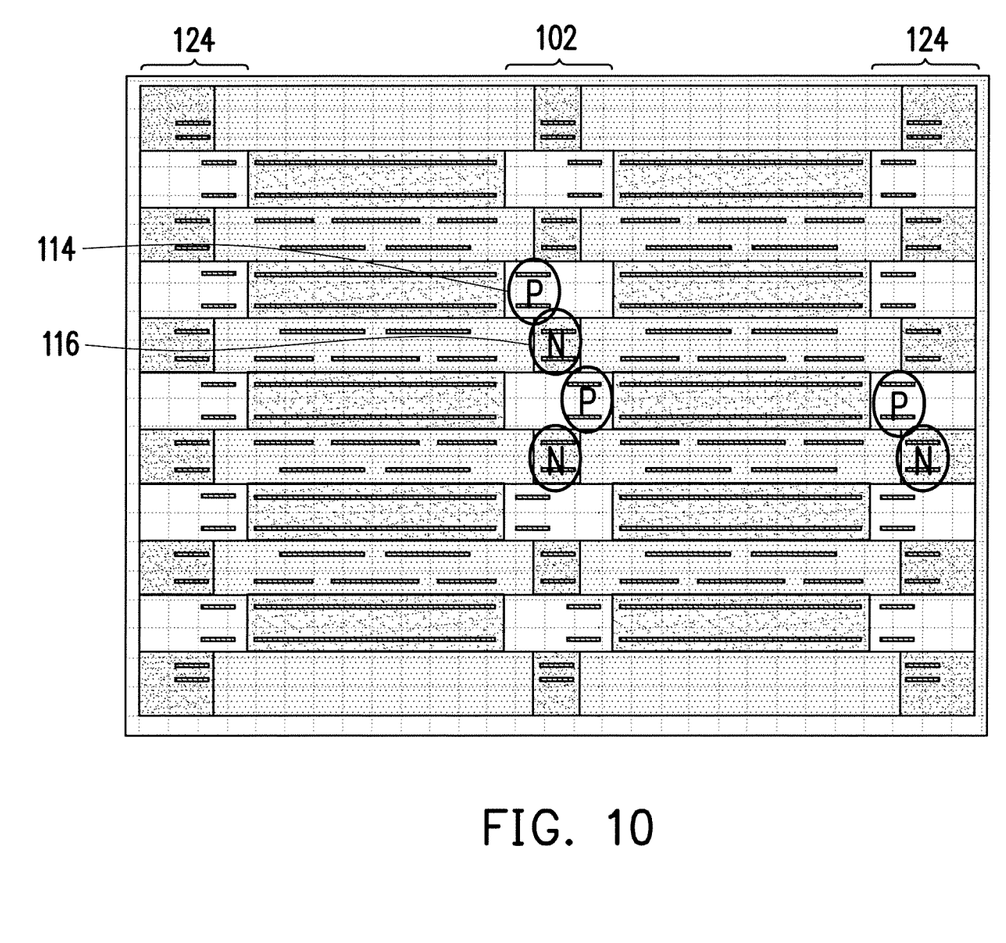
FIG. 10 is a schematic diagram of a partial layout of a memory device according to an embodiment of the invention.

FIG. 10 is a schematic diagram of a partial layout of a memory device according to an embodiment of the invention. Referring to FIG. 10, after the manufacturing process in FIG. 9 is completed, subsequent manufacturing processes of the P-pickup structures 114 and the N-pickup structures 116 are completed. Arrangement rules of the P-pickup structures 114 and the N-pickup structures 116 are described in FIG. 2 and FIG. 3. The N-pickup structures 116 are aligned on a line. The N-pickup structures 116 are taken for example, the P-pickup structures 114 are alternatively distributed with the N-pickup structures 116 in the first direction (the vertical direction) and are interleavingly distributed with the N-pickup structures 116 in a second direction (the horizontal direction).

Figure 11:
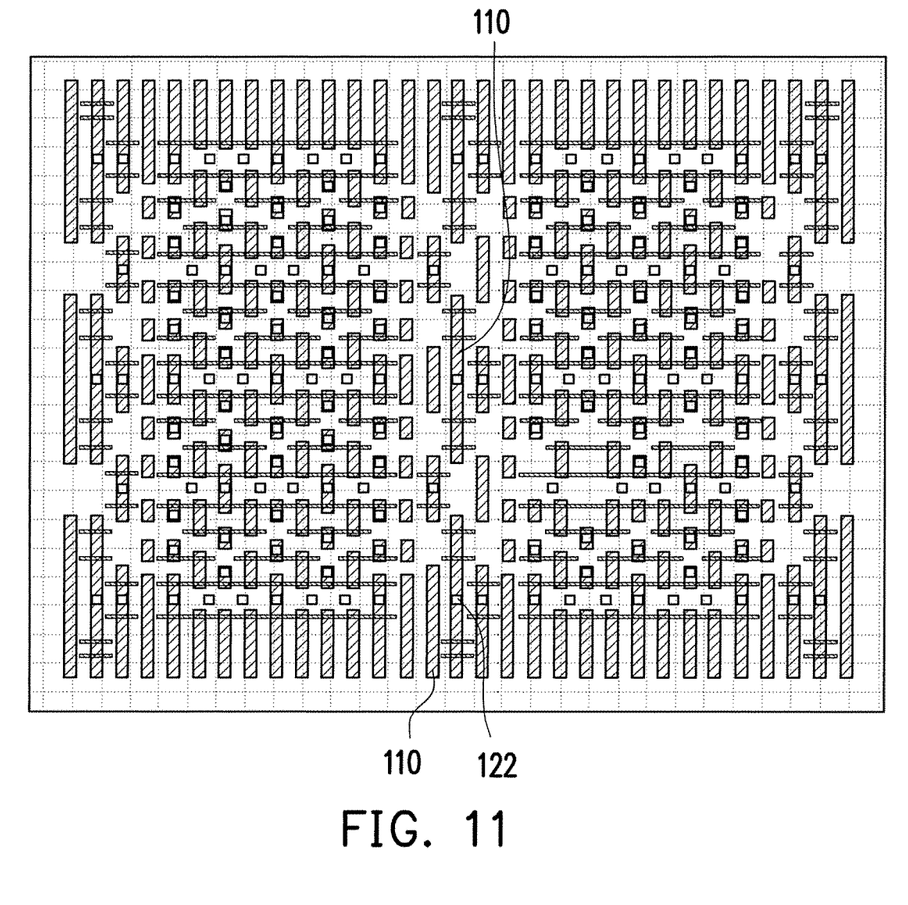
FIG. 11 is a schematic diagram of a partial layout of a memory device according to an embodiment of the invention.

FIG. 11 is a schematic diagram of a partial layout of a memory device according to an embodiment of the invention. Referring to FIG. 11, the manufacturing process of the connecting structure 110 is completed subsequently as well. In addition, the manufacturing process of the contact point structure 122 is also completed, to transmit the substrate voltage to corresponding P/N-type well region 118/120 at the bottom. Afterwards, the structural layouts as shown in FIG. 2 and FIG. 3 are completed. Here, the connecting structure 110 also includes the dummy pickup structures 114d, such that the structure becomes bilaterally symmetrical. As the fin structures are used by the structure of the FinFET to provide the source and the drain, weaker structural strength can thus be observed. As such, the structure of the FinFET is easily deformed when affected by the stress of the materials during the manufacturing process. In the embodiments of the invention, the pickup area 102 may achieve more symmetrical structure, such that performance of the FinFET may be maintained at a consistent level.

Figure 12:
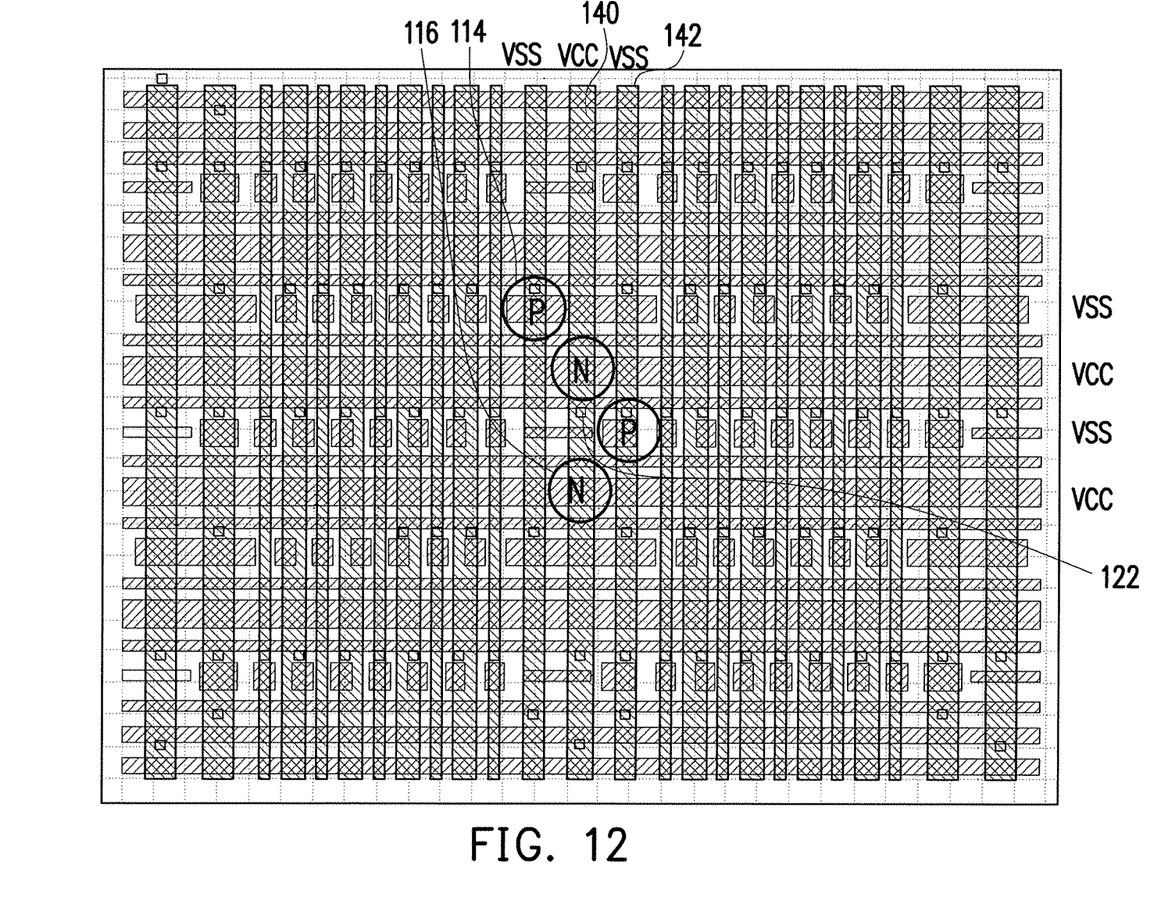
FIG. 12 is a schematic diagram of a partial layout of a memory device according to an embodiment of the invention.

FIG. 12 is a schematic diagram of a partial layout of a memory device according to an embodiment of the invention. Referring to FIG. 8, in a range of the pickup area, a Vcc power line 140 located on an upper layer and a Vss power line 142 are formed in the first direction (the vertical direction). Substrate voltages received on the power line 140 and the power line 142 are transmitted the corresponding P/N-type well regions 118/120 extending in the second direction (the horizontal direction) through internal connecting structures such as the contact point structure 122 and the connecting structure 110. The transistors forming above the P-type well regions 118 are the N-type transistors, and the transistors formed above the N-type well regions 120 are the P-type transistors.

In the embodiments of the invention, the layouts of the N-pickup structures and the P-pickup structures are arranged on the pickup area 102, such that the N-pickup structure is distributed in a column direction. In addition, the P-pickup structures are distributed in the column direction to be alternatively disposed with the N-pickup structures; nevertheless, the P-pickup structures are interleavingly disposed on the right side and the left side on the N-pickup structures. Moreover, the dummy pickup structures are also disposed on another side corresponding to the P-pickup structures to achieve structural symmetry.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A memory device, having a plurality of static random-access memory (SRAM) cells, and the memory device comprising:
    a pickup area, extending in a first direction, wherein the pickup area comprises:
        at least one N-pickup structure, distributed along an N-pickup line, the N-pickup line extending in the first direction, wherein the at least one N-pickup structure receives a first substrate voltage;
        at least one P-pickup structure, alternatively disposed with the at least one N-pickup structure in the first direction and interleaving disposed with the at least one N-pickup structure in a second direction, wherein the second direction is perpendicular to the first direction, wherein the at least one P-pickup structure receives a second substrate voltage; and
        at least one dummy pickup structure, distributed in the first direction, opposite to the at least one P-pickup structure with respect to the N-pickup line; and
    a cell area, adjacent to the pickup area, wherein at least one of the SRAM cells is distributed in the second direction and forms at least one memory row, and the at least one memory row comprises an N-type well region in the second direction and two P-type well regions sandwiching the N-type well region in the second direction,
    wherein the at least one N-pickup structure provides the first substrate voltage to the respective corresponding N-type well region, and the at least one P-pickup structure provides the second substrate voltage to the at least one respective corresponding P-type well region.

2. The memory device as claimed in claim 1, wherein the cell area comprises a first array area and a second array area sandwiching the pickup area, wherein the two P-type well regions of the at least one memory row is a first P-type well region and a second P-type well region, wherein the at least one P-pickup structure comprises:
    a first P-pickup structure, located at a first side of the pickup area to provide the second substrate voltage to the first P-type well region; and
    a second P-pickup structure, located at a second side of the pickup area opposite to the first side to provide the second substrate voltage to the second P-type well region.

3. The memory device as claimed in claim 2, wherein an N-pickup line is located at a middle of the pickup area, and the at least one P-pickup structure is alternatively disposed at a left side and a right side of the N-pickup line or at the right side and the left side of the N-pickup line.

4. The memory device as claimed in claim 2, wherein the pickup area comprises six or more polysilicon lines of even numbers extending in the first direction.

5. The memory device as claimed in claim 1, wherein the pickup area is opposite to an edge area of the cell area, wherein the at least one P-pickup structure is distributed along a P-pickup line, and the P-pickup line extends in the first direction and is located between the N-pickup line and an edge of the cell area.

6. The memory device as claimed in claim 5, wherein the pickup area comprises four or more polysilicon lines extending in the first direction.

7. The memory device as claimed in claim 1, wherein each of the SRAM cells comprises at least one P-type fin field effect transistor (FinFET), at least one first N-type FinFET, and at least one second N-type FinFET, wherein the at least one P-type FinFET is disposed in the same corresponding N-type well region, the at least one first N-type FinFET is disposed above the respective corresponding P-type well region, and the at least one second N-type FinFET is disposed above the same respective corresponding P-type well region.

8. The memory device as claimed in claim 1, wherein each of the SRAM cells comprises six FinFETs.

9. The memory device as claimed in claim 1, wherein the pickup area and the cell area are adjacent areas planned on a substrate.

10. The memory device as claimed in claim 9, wherein a surface of the substrate has at least one fin structure extending in the second direction.

11. The memory device as claimed in claim 10, further comprising a dielectric layer, disposed on the substrate and located between the at least one fin structure, wherein the dielectric layer is lower than the at least one fin structure.

12. The memory device as claimed in claim 9, wherein the at least one N-pickup structure in the pickup area comprises:
    at least one fin structure, formed on an upper surface of the substrate and extending in the second direction;
    a dielectric layer, disposed on the substrate and located between the at least one fin structure, wherein the dielectric layer is lower than the at least one fin structure; and
    an electrically-connected structure, located on the dielectric layer and extending in the first direction, crossing through and being in contact with the at least one fin structure.

13. The memory device as claimed in claim 12, wherein two adjacent N-pickup structures share the same electrically-connected structure.

14. The memory device as claimed in claim 12, the electrically-connected structure crossing through two adjacent fin structures.

15. The memory device as claimed in claim 12, further comprising a contact point structure, connected to the electrically-connected structure.

16. The memory device as claimed in claim 1, the two adjacent N-pickup structures are connected to each other through the shared electrically-connected structure for providing the first substrate voltage to two adjacent P-type well regions.

17. The memory device as claimed in claim 9, wherein the at least one P-pickup structure located in the pickup area comprises:
    at least one fin structure, formed on an upper surface of the substrate and extending in the second direction;
    a dielectric layer, disposed on the substrate and located between the at least one fin structure, wherein the dielectric layer is lower than the at least one fin structure; and
    an electrically-connected structure, located on the dielectric layer and extending in the first direction, crossing through and being in contact with the at least one fin structure.

18. The memory device as claimed in claim 17, wherein the electrically-connected structure crossing through two adjacent fin structures.

19. The memory device as claimed in claim 17, wherein the at least one dummy pickup structure is also disposed on the dielectric layer but is not in contact with the at least one fin structure.

20. The memory device as claimed in claim 1, wherein the polysilicon lines extending in the first direction are further comprised in the second direction between the at least one N-pickup structure and the at least one P-pickup structure, wherein two polysilicon lines symmetrical to the N-pickup line are comprised between the at least one P-pickup structure and the at least one dummy pickup structure.

* * * * *